United States Patent [19]

Kimura

[11] Patent Number: 4,634,126

[45] Date of Patent: Jan. 6, 1987

[54] DEVICE FOR CONVERTING THE AMOUNT OF A MECHANICAL DISPLACEMENT INTO ELECTRICAL SIGNAL

[75] Inventor: Yutaka Kimura, Osaka, Japan

[73] Assignee: Kabushiki Kaisha Universal, Tochigi, Japan

[21] Appl. No.: 716,192

[22] Filed: Mar. 26, 1985

[30] Foreign Application Priority Data

Mar. 26, 1984 [JP] Japan ............................ 59-41832[U]

[51] Int. Cl.$^4$ ............................................ H01F 21/06
[52] U.S. Cl. ............................... 273/129 S; 324/208; 335/266; 335/268; 335/298; 336/77; 336/117; 336/129; 336/136; 273/121 A
[58] Field of Search ................. 273/129 S, 121 A; 324/208, 359; 335/266, 268, 298; 336/75, 77, 45, 115, 117, 123, 129, 130, 136

[56] References Cited

U.S. PATENT DOCUMENTS

| | | | |
|---|---|---|---|
| 2,881,408 | 4/1959 | Dudley | 336/123 |
| 3,827,291 | 8/1974 | McCalvey | |
| 4,065,715 | 12/1977 | Jaffe et al. | |
| 4,189,674 | 2/1980 | Lathlaen | |
| 4,284,961 | 8/1981 | Landau | 331/65 |
| 4,295,651 | 10/1981 | Konta | |
| 4,322,727 | 3/1982 | Zabler et al. | 336/45 |
| 4,339,739 | 7/1982 | Dron | 336/136 |
| 4,390,796 | 6/1983 | McClenahan et al. | |

OTHER PUBLICATIONS

"Twenty-Eighth IEEE Vehicular Technology Conference", Denver, CO, Mar. 22-24, 1978, A Multifunction Integrated Circuit for Automotive Sensors, pp. 533-536.

Primary Examiner—Richard C. Pinkham
Assistant Examiner—MaryAnn Stoll Lastova
Attorney, Agent, or Firm—Young & Thompson

[57] ABSTRACT

A transducer converts the amount of mechanical displacement of a member into an electrical signal by magnetic induction. Two fixed coils different in winding direction from each other are spaced apart from each other by a suitable distance and connected in series. Inside the fixed coils, a movable coil is disposed which moves in cooperative association with the member whose amount of movement is to be detected. With the movable coil supplied with an a.c. current, the fixed coils produce an induction current whose amplitude varies with the relative position of the movable coil. A signal processing circuit generates a pulse having a duty ratio corresponding to the amplitude of the induction current. This pulse is converted into a d.c. current in a smoothing circuit to obtain a d.c. voltage corresponding to the amount of mechanical displacement. In a pinball machine, the amount of this voltage regulates the force with which the plunger of a solenoid strikes a ball, thereby to correlate the amount of movement of a handle manipulated by the player with the trajectory of the ball on a playing field.

6 Claims, 3 Drawing Figures

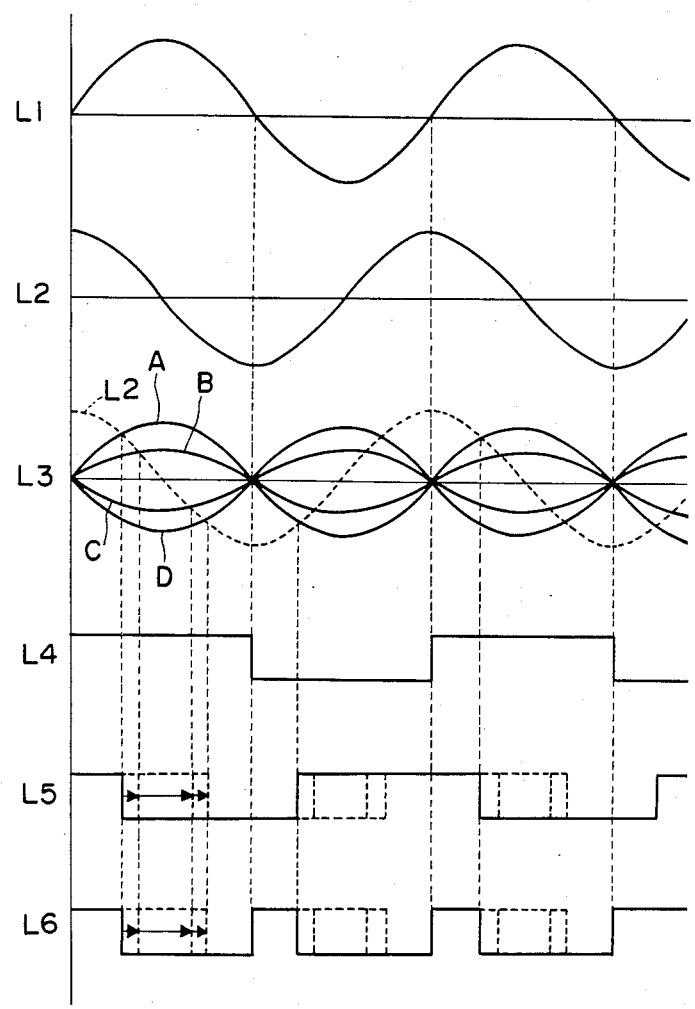

DEVICE FOR CONVERTING THE AMOUNT OF A MECHANICAL DISPLACEMENT INTO ELECTRICAL SIGNAL

FIELD OF THE INVENTION

The present invention relates to tranducers using magnetic induction for converting the amount of a mechanical displacement into an electrical signal.

BACKGROUND OF THE INVENTION

Transducers have been widely used for converting the amount of a mechanical displacement into an electrical signal. It is known in the art, for example, to provide members which are manually rotated or slid, the amount of movement of such members providing a corresponding electrical signal. Among the known members of such kind are tuning or adjusting knobs for radio receivers and the operating handles for pinball machines.

In pinball machines in particular, if the player pulls the operating handle, the resultant amount of movement of the handle changes the voltage across a solenoid plunger. Since the speed of movement of the plunger varies with the value of the voltage across the solenoid plunger, it is possible to control the shooting speed of a ball. Thus, to aim the ball at a desired target on a playing field, the player imparts to the handle movement of a magnitude proportional to the force with which he wishes the ball to be shot. By contrast, if the amount of manipulation of the operating handle is less, then the ball is shot with a weaker force. in this way, the player obtains the desired propulsive force by adjusting the amount of his manipulation of the operating handle. Therefore, it is necessary for the transducer to have no play over the range within which the manipulation amount can be changed, and to maintain the correct correspondence between the manipulation amount and the propulsive force.

Conventionally, a variable resistor has been utilized for detecting the manipulation amount described above. Variable resistors, however, have a problem that their mechanical life is relatively short.

It might be thought that the conversion of mechanical movement into an electrical signal could be effected by using various types of optical transducers, for example, a pulse counter type transducer. But in order to achieve sufficient precision of the transducer, a high precision is required for the associated gear mechanisms or electronic circuits. As a result, the apparatus becomes expensive. Moreover, the optical transducer system necessitates taking countermeasures against foreign matter and dust. Therefore, there arose the problem that an inexpensive, simple, and highly reliable transducer was not previously available.

OBJECTS OF THE INVENTION

It is therefore an object of the present invention to provide a transducer which is durable and highly reliable.

It is another object of the present invention to provide a transducer which is simple in construction and inexpensive.

SUMMARY OF THE INVENTION

In order to achieve the above and other objects of the present invention, a first coil driven by an a.c. signal and a second coil disposed adjacent to the first coil are utilized. The two coils are movable relative to each other. By the magnetic induction action between the two coils, the amount of displacement of a movable member is converted into an electrical signal. The second coil derives an induction current corresponding to its position relative to the first coil. The amplitude of the induction current is converted into a duty ratio of a pulse signal which is smoothed and converted into a d.c. signal.

In a ball shooting apparatus embodying the present invention, the transducer is in cooperative association with an operating handle, and a solenoid plunger is provided for shooting a ball which is initially stationary at a shooting position. The d.c. signal output from the transducer is supplied to a driver of the solenoid plunger. The driver adjusts the voltage applied to the solenoid plunger in accordance with the input d.c. signal, thereby varying the shooting impact of the solenoid plunger against the ball.

According to the present invention, the amount of displacement of a manipulable member is converted into an electrical signal using magnetic induction. Thus, non-contact detection of the amount of mechanical displacement can be performed. Therefore, the durability of the apparatus is improved and the degrading of signals due to foreign matter as in an optical system does not occur. Moreover, it is possible to detect the amount of movement with a high precision with a simple construction. Furthermore, the associated electrical circuit has low-pass characteristics so that suppression of noises can be effected.

BRIEF DESCRIPTION OF THE DRAWINGS

FIG. 3 is a graph showing signal waveforms in the signal processing circuit of FIG. 2.

DETAILED DESCRIPTION OF THE INVENTION

Figure 1:
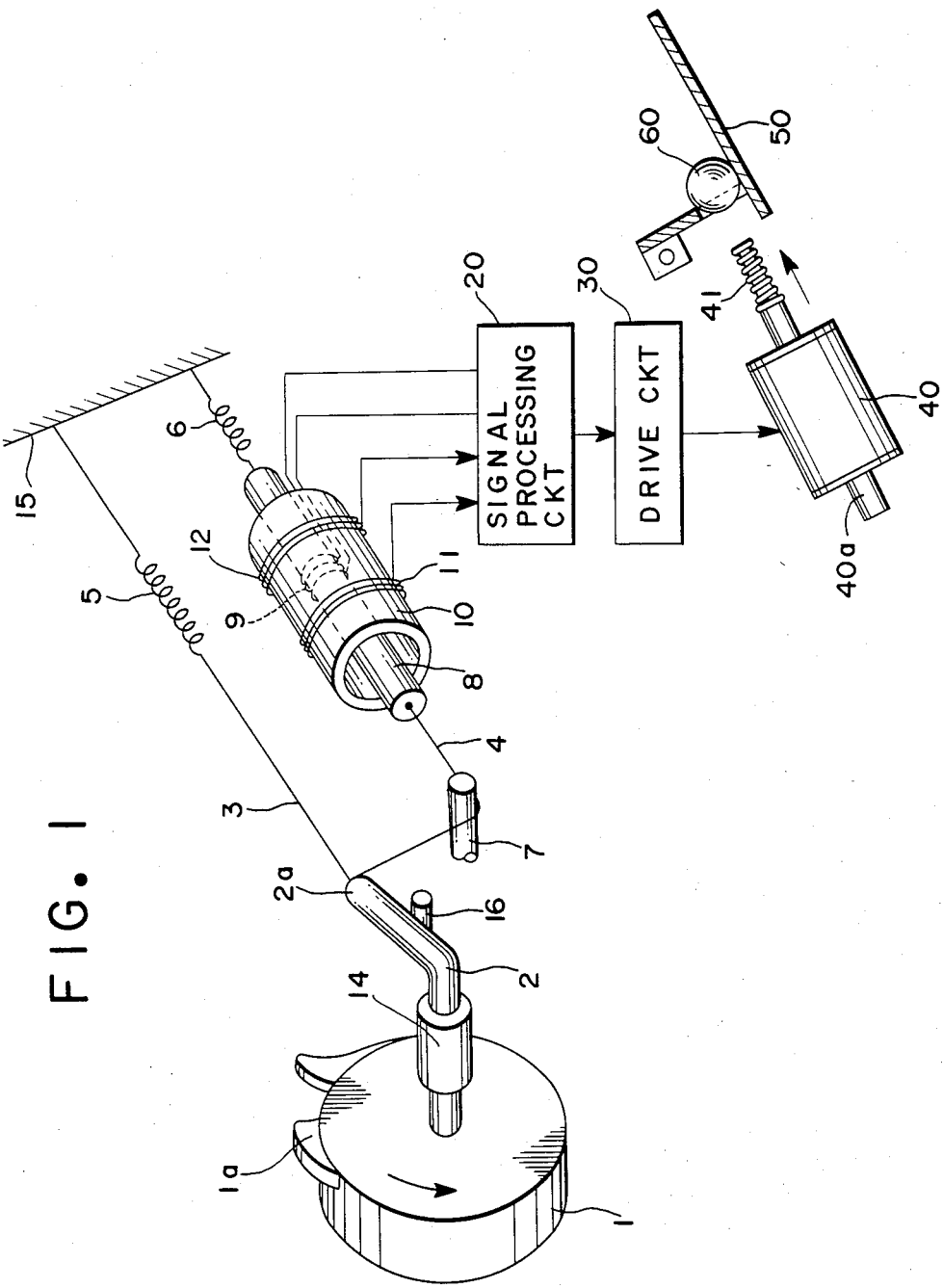
FIG. 1 is a diagram showing a ball shooting device of a pinball game machine incorporating a transducer according to the present invention.

Referring to FIG. 1, a pinball machine includes, as is well known in the art, a playing field (not shown) covered with transparent glass (not shown). On a panel (not shown) positioned beneath the transparent glass, an operating handle 1 is pivotally mounted. The operating handle 1 is provided with a finger grip 1a by which handle 1 is rotated in the direction of the arrow in order to shoot a ball. On the inner side of the operating handle 1, an L-shape bar 2 is mounted. A bush 14 fixed to the panel rotatably mounts the L-shape bar 2 whereby the operating handle 1 rotates the L-shape bar 2.

Two flexible wires 3 and 4 are coupled to the distal end 2a of the L-shape bar 2. The wire 3 is fixedly connected at its one end to a fixed base 15 through a tension spring 5 which urges the L-shape bar 2 to abut a fixed pin 16 at a neutral position. The other flexible wire 4 is deflected about a fixed guide 7 and is coupled at its one end to the distal end 2a of bar 2 and at its other end to one end of a movable bar 8 made of a material that does not affect the fields generated, that is, a material with a dielectric constant of approximately one. The other end of the movable bar 8 is coupled to another tension spring 6 which is secured to the fixed base 15 and resists movement of bar 8 as the operating handle 1 is turned in the direction of the arrow.

A coil 9 is wound about and is movable with the movable bar 9, the movable coil 8 being supplied as a driving current with an a.c. signal from a signal processing circuit 20. In order to detect, using magnetic induction action, a magnetic field generated by the movable coil 9, fixed coils 11 and 12 are provided which are in series and wound oppositely relative to each other and spaced apart a predetermined distance. The fixed coils 11 and 12 are wound on and about a hollow cylindrical tube 10 of a material having the same properties as that of the movable bar 8, which tube 10 is disposed concentrically with the movable bar 8. The fixed coils 11 and 12 are fixed on the tube 10 for example with tape, an adhesive or the like. The hollow cylindrical tube 10 is fixedly mounted on the game machine body.

An a.c. current induced in the fixed coils 11 and 12 is converted into a d.c. voltage by the signal processing circuit 20. The d.c. voltage is input to a drive circuit 30 and in turn drives the plunger 40a of a solenoid 40. The drive circuit 30 is comprised by a pulse generator and an amplifier for amplifying a pulse from the pulse generator. The drive circuit 30 supplies to the solenoid 40 a driven pulse having an amplitude varying in accordance with the input d.c. voltage. The solenoid 40, as is well known in the art, advances the plunger 40a when the solenoid coil (not shown) is energized. On the end of the plunger 40a, a spring 41 for absorbing impact and damping sound is mounted.

Each time a driven pulse with an amplitude controlled as above is supplied, the plunger 40a advances to strike a ball 60 disposed at a shooting position. Under the impact of spring 41, the ball 60 is guided along a guide rail 50 and onto the playing field (not shown). The plunger 40a is returned to the original position as shown in FIG. 1 by a built-in spring or the like after the ball 60 is shot.

Figure 2:
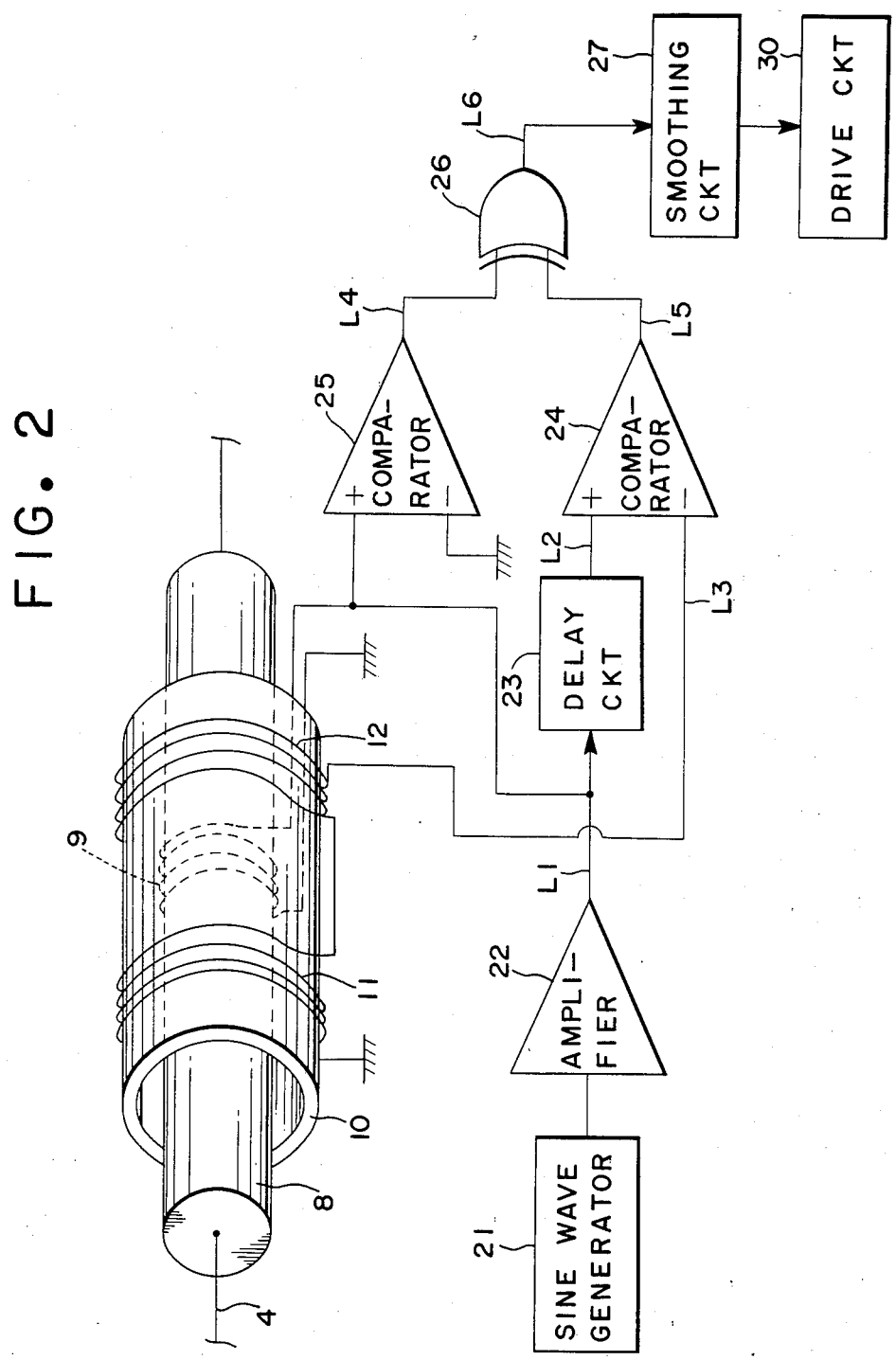
FIG. 2 is a circuit diagram showing one example of the signal processing circuit of FIG. 1.

In FIG. 2 particularly showing the signal processing circuit, an a.c. signal from a sine wave generator 21 is supplied through a drive amplifier to one end of the movable coil 9 wound about the movable bar 8, the other end being grounded. One end of the fixed coil 11 wound about the hollow cylindrical tube 10 is connected to one end of the fixed coil 12 wound in the opposite direction to that of the fixed coil 12, the other end of the fixed coil 11 being grounded. The other end of the fixed coil 12 is connected to a negative input terminal of a comparator 24. The positive input terminal of the comparator 24 is input with a signal obtained by delaying an output from the amplifier 22 by $\pi/2$ in phase in a delay circuit 23.

The output signal from the amplifier 22 is input to the positive input terminal of a comparator 25 of which the negative input terminal is grounded. The output terminals of both comparators 24 and 25 are connected to both input terminals of an exclusive OR gate 26. The output signal from the gate 26 is converted into a d.c. signal in a smoothing circuit 27, and the d.c. signal is input to the plunger drive circuit 30 described above.

Signal waveforms in respective signal lines in the circuit diagram of FIG. 2 are shown in FIG. 3.

The operation of the above embodiment is as follows:

So long as the operating handle 1 is not turned, the L-shaped bar 2 abuts the fixed pin 16, and the movable coil 9 and fixed coil 12 are axially aligned with each other. The signal from the sine wave generator 21 is amplified by the amplifier 22 and the obtained sine wave signal L1 is supplied to the movable coil 9 and to the comparator 25. The comparator 25 outputs a rectangular wave signal L4 as shown in FIG. 4. The sine wave signal L1 is delayed by $\pi/2$ in phase in the delay circuit 23, and in turn the delayed signal L2 is input to the positive terminal of the comparator 24. Upon delivery of the sine wave signal L1 to the movable coil 9, the waveform of an induced signal L3 on the fixed coil 12 becomes the same waveform A as that of the sine wave signal L1. Therefore, a rectangular wave signal L6 shown by a solid line is output from the gate 26.

Next, as the operation handle 1 is turned in the direction of the arrow, the wire 4 slides about guide 7 and tensions the spring 6 thereby to move the movable bar 8 to the left within the hollow cylindrical tube 10. The movable coil 9 together with the movable bar 8 are moved to the left to approach axially the fixed coil 11. Since the fixed coils are wound oppositely to each other, the currents induced in the respective fixed coils 11 and 12 tend to cancel each other. As a result, when the movable coil 9 is positioned intermediate the fixed coils 11 and 12, the signal L3 becomes zero. If the movable coil 9 moves beyond the intermediate position and approaches more closely the fixed coil 11, then a waveform D opposite in phase to the waveform A is obtained. As will therefore be appreciated, the signal L3 has a waveform A when the movable coil 9 is in registry with the fixed coil 12; a waveform B when the movable coil 9 moves toward the fixed coil 11; and in succession a waveform C and finally a waveform D when the movable coil 9 is in registry with the fixed coil 11.

The comparator 24 compares the signal L2 with the signal L3 to output a signal L5. The signal L5 has a phase corresponding to the position of the movable coil 9, the phase being shifted as shown by arrows to the right as the movable coil 9 approaches the fixed coil 11. The gate 26 detects the correspondence between the signals L4 and L5, and in turn outputs a signal L6 having a different pulse width in accordance with the phase shift of the signal L5. That is, as the movable coil approaches the fixed coil 11, the duty ratio of the signal L6 becomes larger. The signal L6 is input to and smoothed in the smoothing circuit 27, and is converted into a d.c. current. The smoothing circuit 27 produces a higher d.c. voltage as the duty ratio becomes larger.

As described above, the amount of manipulation of the operating handle 1 is converted into a d.c. voltage by means of the movable coil 9, fixed coils 11 and 12, and signal processing circuit 20. This d.c. voltage is applied to the known drive circuit 30 to drive the solenoid plunger 40. Therefore, the solenoid plunger 40a strikes the ball 60 with an impact corresponding to the amount of angular movement of the operating handle 1 and at predetermined intervals. The actual operation of the operating handle 1 is such that a small angular movement causes the power source for the circuits to turn on and a further movement causes the movable bar 8 to start moving.

In the above embodiment, a movable coil has been used as a coil 9, however, the coil 9 may be fixed and the coils 11 and 12 may be moved, by making the hollow cylindrical tube 10 movable instead of the coil 9. Obviously, many other modifications and variations of the present invention are possible in the light of the above teachings. It is therefore to be understood that the scope of the invention is to be determined solely by the following claims.

What is claimed is:

1. A transducer for converting the amount of mechanical displacement of a member (1) into an electrical signal, comprising:
   first coil means (9) driven by an a.c. signal (L1);
   second means (11, 12) disposed adjacent to said first coil means (9) for generating an induction current (L3) that varies as the change of a magnetic field produced by said first coil means (9), said second means comprising two coils (11, 12) opposite in winding direction to each other, said two coils (11, 12) being connected in series and spaced apart from each other by a predetermined distance;
   a movable member (8) moved by said member (1) for changing the spatial relations between said first coil means (9) and said second coil means (11, 12) by making said first and second coil means move relative to each other;
   means (23, 24, 25, 26) for converting the amplitude of said induction current (L3) into the duty ratio of a pulse (L6), said means comprising: a first comparator (25) for comparing said a.c. signal (L1) with a reference potential; a delay circuit (23) for delaying said a.c. signal (L1) by a predetermined angle in phase; a second comparator (24) for comparing an output signal (L2) from said delay circuit (23) with said induction current (L3); and an exclusive OR gate (26) for inputting the output signals from both comparators (25, 24); and
   means (27) for smoothing and converting said pulse (L6) into a d.c. current.

2. A transducer according to claim 1, wherein said first coil means (9) is a movable coil and said two coils (11, 12) are fixed.

3. A transducer according to claim 2, wherein said movable coil (9) is movable between said first fixed coil (11) and said second fixed coil (12).

4. A transducer according to claim 3, wherein said movable member (8) is formed from a material that does not affect the fields generated by said movable and fixed coils, and said movable coil (9) is wound about the outer periphery of said movable member.

5. A transducer according to claim 4, further comprising a hollow cylindrical tube of a material having the same properties as that of said movable member (8), said tube (10) encircling said movable member (8), said first fixed coil (11) and said second fixed coil (12) being wound about the outer periphery of said hollow cylindrical tube.

6. A transducer according to claim 1, wherein said member whose movement is to be detected is an operating handle (1), said operating handle and said movable member (8) being coupled by a wire (4).

* * * * *